United States Patent
Chen et al.

(10) Patent No.: US 8,981,512 B1
(45) Date of Patent: Mar. 17, 2015

(54) OPTICAL SHIELD IN A PIXEL CELL PLANARIZATION LAYER FOR BLACK LEVEL CORRECTION

(71) Applicant: OmniVision Technologies, Inc., Santa Clara, CA (US)

(72) Inventors: Gang Chen, San Jose, CA (US); Jin Li, San Jose, CA (US); Duli Mao, Sunnyvale, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/030,395

(22) Filed: Sep. 18, 2013

(51) Int. Cl.
*H01L 31/0232* (2014.01)
*H01L 21/00* (2006.01)
*H01L 31/18* (2006.01)

(52) U.S. Cl.
CPC ............ *H01L 31/0232* (2013.01); *H01L 31/18* (2013.01)
USPC ............................................ 257/432; 438/70

(58) Field of Classification Search
CPC .... H01L 21/76807; H01L 31/18; H01L 31/10
USPC ............................................... 257/432; 438/70
See application file for complete search history.

(56) References Cited

U.S. PATENT DOCUMENTS

| | | | |
|---|---|---|---|
| 6,793,389 B2* | 9/2004 | Chavan et al. | 374/179 |
| 8,569,681 B2* | 10/2013 | Ovsiannikov et al. | 250/226 |
| 2006/0237629 A1 | 10/2006 | Oda | |
| 2008/0217712 A1 | 9/2008 | Rossi et al. | |
| 2010/0134646 A1 | 6/2010 | Tamura | |
| 2011/0018801 A1* | 1/2011 | Wang et al. | 345/158 |
| 2012/0098081 A1 | 4/2012 | Horiike et al. | |

* cited by examiner

*Primary Examiner* — William D Coleman
(74) *Attorney, Agent, or Firm* — Blakely Sokoloff Taylor & Zafman LLP

(57) ABSTRACT

A pixel array includes a plurality of photodiodes disposed in a semiconductor layer and arranged in the pixel array. A color filter layer is disposed proximate to the semiconductor layer. Light is to be directed to at least a first one of the plurality of photodiodes through the color filter layer. An optical shield layer is disposed proximate to the color filter layer. The color filter layer is disposed between the optical shield layer and the semiconductor layer. The optical shield layer shields at least a second one of the plurality of photodiodes from the light.

22 Claims, 3 Drawing Sheets

OPTICAL SHIELD IN A PIXEL CELL PLANARIZATION LAYER FOR BLACK LEVEL CORRECTION

BACKGROUND INFORMATION

1. Field of the Disclosure

This disclosure relates generally to photodetectors, and in particular but not exclusively, relates to black level correction in image sensors.

2. Background

As pixel size scales down and array resolution scales up, construction of black level correction ("BLC") pixels, and color filters faces increasingly difficult technical hurdles to overcome in next generation optical devices. Conventional methods of fabricating BLC pixels and color filters result in undesirable electrical signals and mechanical stresses in pixel arrays. Changes in temperature, humidity, and voltage can increase the magnitude of these unwanted effects when employing a traditional architecture.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a backside illuminated ("BSI") imaging system with black reference pixels are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" or "one example" means that a particular feature, structure, or characteristic described in connection with the embodiment is included in at least one embodiment of the present invention. Thus, the appearances of the phrases "in one embodiment" or "in an embodiment" or "one example" in various places throughout this specification are not necessarily all referring to the same embodiment. Furthermore, the particular features, structures, or characteristics may be combined or eliminated in any suitable manner in one or more embodiments.

Throughout this specification, several terms of art are used. These terms are to take on their ordinary meaning in the art from which they come, unless specifically defined herein or the context of their use would clearly suggest otherwise.

Here, examples in accordance with the teachings of the present invention address contributing factors to diminished image sensor performance with respect to black level correction. As will be discussed, an improved BLC ratio is achieved with an optical shield layer that is deposited after a color filter layer in accordance with the teachings of the present invention, because BLC pixels experience a mechanical and electrical environment similar to pixels that receive light. Additionally, better color uniformity is achieved if color filters are not fabricated on a prior patterned metal topography.

Figure 1A:
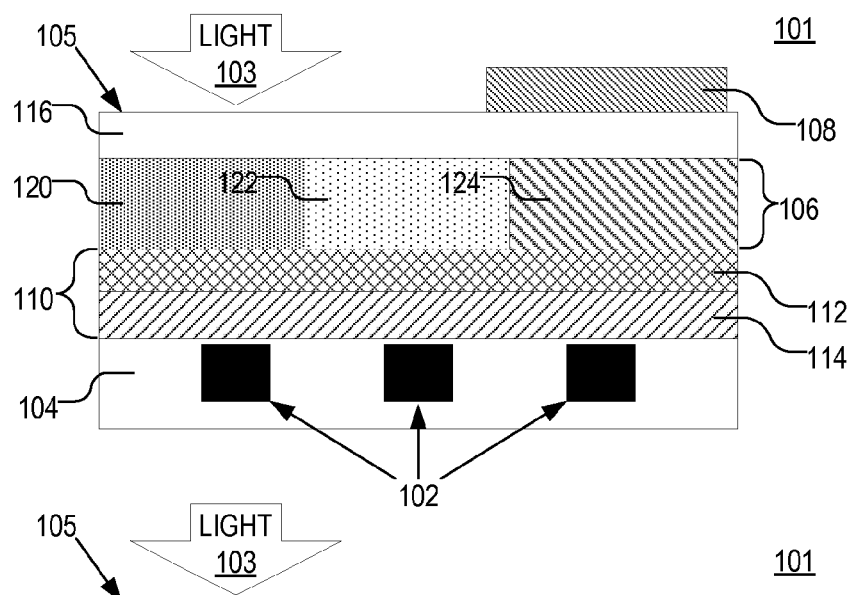
FIG. 1A is a diagram illustrating one example of a cross-section of a portion of a pixel array where an optical shield layer is deposited on a planarization layer, in accordance with an embodiment of the disclosure.
Figure 1B:
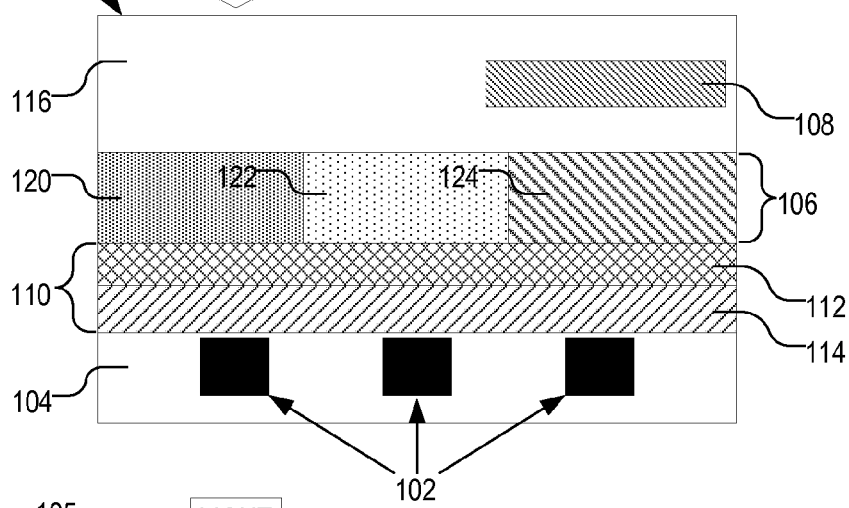
FIG. 1B is a diagram illustrating one example of a cross-section of a portion of a pixel array where an optical shield layer is deposited in a planarization layer, in accordance with an embodiment of the disclosure.
Figure 1C:
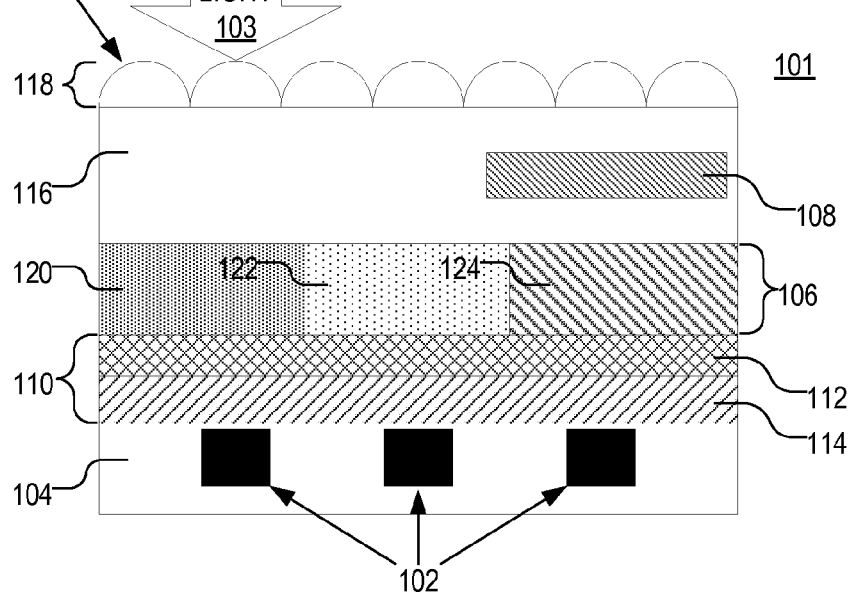
FIG. 1C is a diagram illustrating one example of a cross-section of a portion of a pixel array where one or more lenses are formed on the planarization layer, in accordance with an embodiment of the disclosure.

To illustrate, FIGS. 1A-1C are cross-section views showing an example of a portion of a pixel array 101 at various stages during fabrication in accordance with the teachings of the present invention. In particular, FIG. 1A shows an example of a plurality of photodiodes 102 arranged in a pixel array 101 and disposed in a semiconductor layer 104. In one example, the semiconductor layer 104 includes silicon. In one example, a color filter layer 106 is disposed proximate to the semiconductor layer 104 as shown, such that light 103 is to be directed to at least one of the plurality of photodiodes 102 through the color filter layer 106. In the depicted example, light 103 is directed to the plurality of photodiodes 102 through a backside 105 of the pixel array 101 as shown. In one example, the color filter layer 106 includes a red color filter 120, a green color filter 122, and a blue color filter 124. In one example, one or more interlayers 110 are disposed between the semiconductor layer 104 and color filter layer 106. In one example, the one or more interlayers 110 include a silicon nitride layer 112 and a silicon carbide layer 114.

As shown in the example depicted in FIG. 1A, an optical shield layer 108 is disposed proximate to the color filter layer 106 such that the color filter layer 106 is disposed between the optical shield layer 108 and the semiconductor layer 104. As such, the optical shield layer 108 shields at least one of the pluralities of photodiodes 102 from light 103 in accordance with the teachings of the present invention. In one example, the optical shield layer 108 includes a metal material such as for example but not limited to aluminum, copper or the like. In one example, a planarization layer 116 is disposed over the color filter layer 106 such that the planarization layer 116, or at least a portion of the planarization layer 116, is disposed between the optical shield layer 108 and the color filter layer 106 as shown in accordance with the teachings of the present invention.

FIG. 1B illustrates the cross-section view of an example of the pixel array 101 of FIG. 1A with an additional portion of the planarization layer 116 deposited over the planarization layer 116, as well as over the optical shield layer 108 on the backside 105 in accordance with the teachings of the present invention. As such, the optical shield layer 108 floats within, or in other words is encapsulated within the planarization layer 116 as illustrated in FIG. 1B in accordance with the teachings of the present invention.

FIG. 1C illustrates the cross-section view of the example of the pixel array 101 of FIG. 1B with one or more lenses 118 fabricated on top of the planarization layer 116 on the backside 105 in accordance with the teachings of the present invention.

It should be noted that the examples shown in FIGS. 1A-1C share the similar trait of having the optical shield layer 108 located proximate to the color filter layer 106 (with the color filter layer 106 located between the optical shield layer 108 and the semiconductor layer 104). As such, the color filter layer 106 is coated onto the backside 105 of the pixel array 101 with no prior patterned metal topography from, for example, the optical shield 108 in accordance with the teachings of the present invention. In other words, the metal of the optical shield layer 108 is deposited after the color filters 120, 122, and 124, of the color filter layer 106 in accordance with the teachings of the present invention. This helps relieve various electro-mechanical stresses that would otherwise result as a consequence of locating the color filter layer 106 in the same plane as the optical shield layer 108 as is done in some conventional device architectures.

Figure 2:
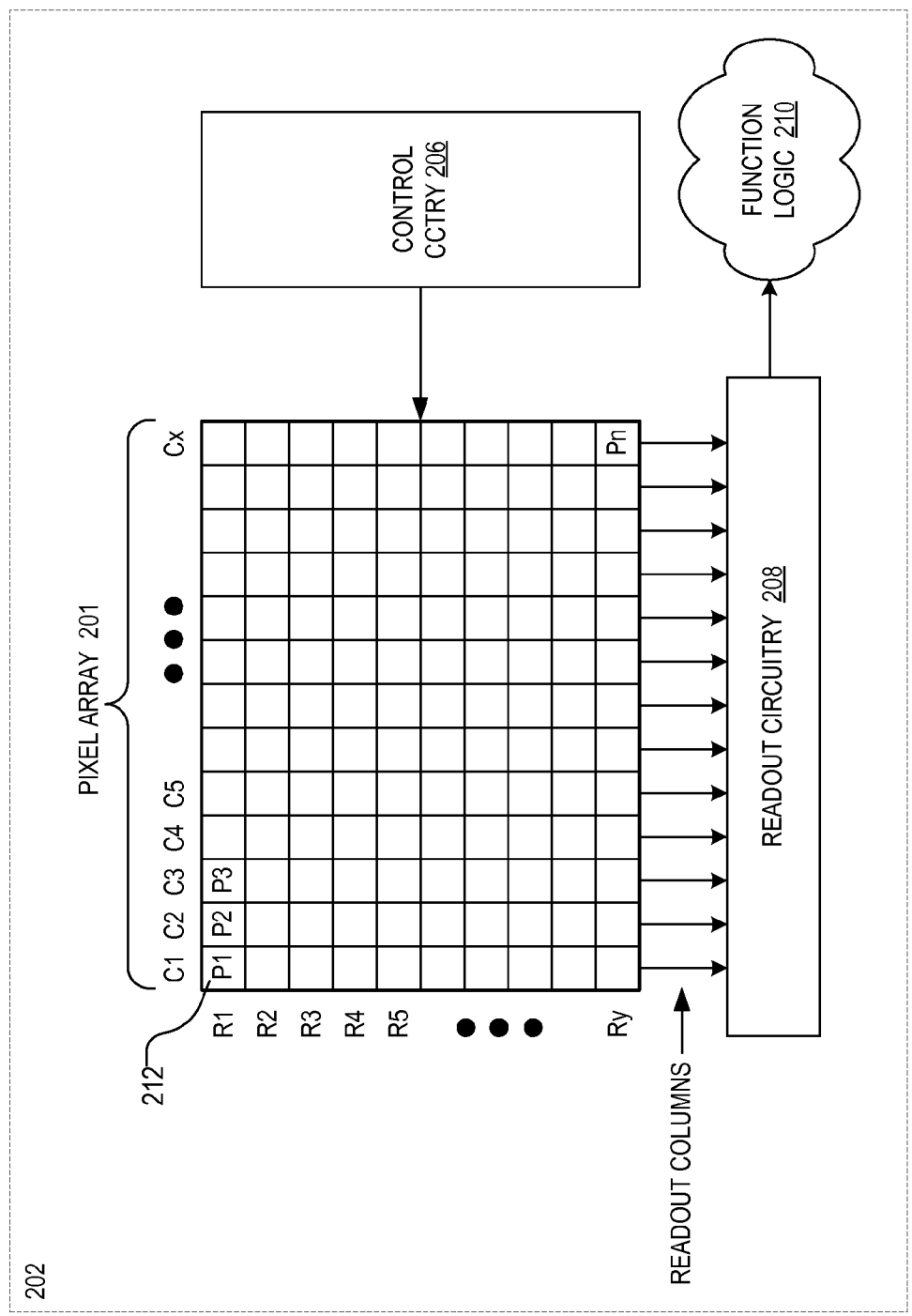
FIG. 2 illustrates a top down view of one example of an imaging system, in accordance with an embodiment of the disclosure.

FIG. 2 is an illustration of an imaging system 202 including an example pixel array 201 (including individual pixels 212), control circuitry 206 coupled to the pixel array 201 to control operation of the pixel array 201, readout circuitry 208 coupled to the pixel array 201 to readout image data from the pixel array 201, and function logic 210 coupled to the readout circuitry 208 to store the image data readout from the pixel array 201.

In one example, the pixel array 201 is a two-dimensional array of image sensors or pixels (e.g., pixels P1, P2, P3 . . . , Pn). It is noted that pixel array 201 may be an example of pixel array 101 of FIGS. 1A-1C, and that similarly named and numbered elements referenced in FIG. 2 may be coupled and function similar to as described above in FIGS. 1A-1C. As illustrated, each pixel 212 can be arranged into a row (e.g., rows R1, R2, R3 . . . , Ry) and column (e.g., column C1, C2, C3 . . . , Cx) to acquire image data of an object, which can then be used to render an image of said object.

In one example, after each pixel 212 has acquired its image data or image charge, the image data is read out by readout circuitry 208 and then transferred to function logic 210. In various examples, readout circuitry 208 may include amplification circuitry, analog-to-digital (ADC) conversion circuitry, or otherwise. In one example, readout circuitry 208 may read out a row of image data at a time along readout column lines (illustrated) or may read out the image data using a variety of other techniques (not illustrated), such as a serial read out or a full parallel read out of all pixels simultaneously. Function logic 210 may simply store the image data or even manipulate the image data by applying post image effects (e.g., crop, rotate, remove red eye, adjust brightness, adjust contrast, or otherwise).

In one example, control circuitry 206 is coupled to pixel array 201 to control operational characteristics of pixel array 201. For example, control circuitry 206 may generate a shutter signal for controlling image acquisition. In one example, the shutter signal is a global shutter signal for simultaneously enabling all pixels 212 within pixel array 201 to simultaneously capture their respective image data during a single acquisition window. In another example, the shutter signal is a rolling shutter signal such that each row, column, or group of pixels 212 is sequentially enabled during consecutive acquisition windows.

Figure 3:
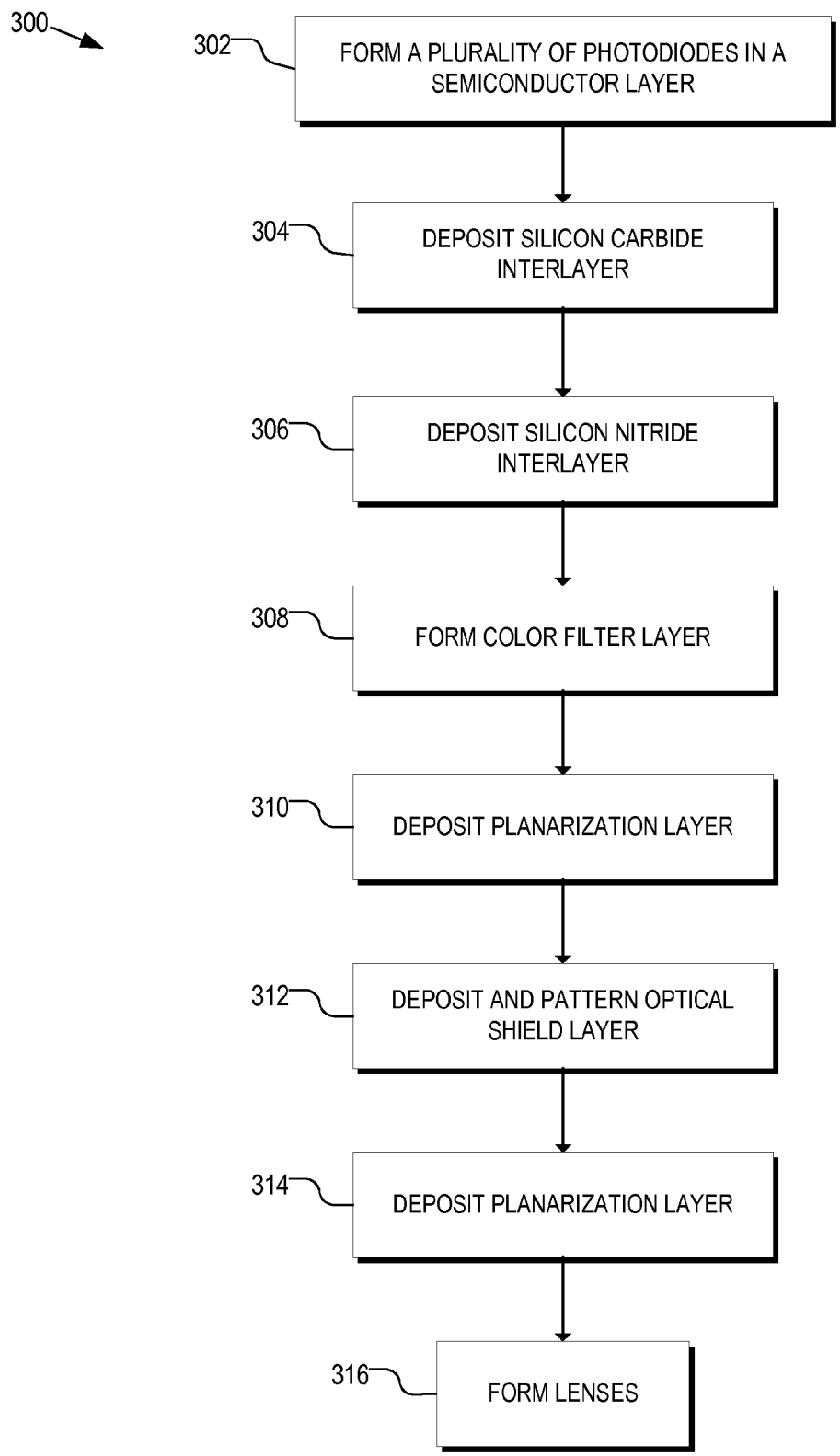
FIG. 3 is a flow chart illustrating one example of a method of forming a pixel array, in accordance with an embodiment of the disclosure.

FIG. 3 is a flow chart of one example of a method of fabricating a pixel array 300. Process block 302 shows that a plurality of photodiodes disposed in a semiconductor layer is formed. One skilled in the art will recognize that there are many possible materials/structures available to achieve the properties necessary for the plurality of photodiodes disposed in a semiconductor layer to function properly with respect to the scope of the present invention. In one example, process blocks 304 and 306 show that silicon carbide and silicon nitride interlayers may then be deposited. Process block 308 shows that a color filter layer is then formed. In one example, as shown in FIG. 1 above, the color filter layer may include red 120, green 122, and blue 124, color filters. Process block 310 shows that a planarization layer is deposited. Process block 312 shows that the optical shield layer is deposited and patterned such that the color filter layer is formed onto the pixel array prior to the optical shield layer being deposited and patterned onto the pixel array, in accordance with the teachings of the present invention. In one example, the optical shield layer includes a metal material such as for example but not limited to aluminum, copper or the like. Process block 314 shows that an additional planarization layer, or at least a portion of the planarization layer, is deposited after the optical shield layer is deposited, such that the optical shield layer floats within, or in other words is encapsulated within the planarization layer, in accordance with the teachings of the present invention. Process block 316 shows that lenses are then formed after the planarization layer is deposited. It is noted that the method of fabricating a pixel array 300 contains steps to fabricate layers of device architecture shown above in FIGS. 1A-1C and FIG. 2, and that similarly named and numbered elements referenced in FIG. 3 may be coupled and function similar to as described above in FIGS. 1A-1C and FIG. 2.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A pixel array comprising:
a plurality of photodiodes disposed in a semiconductor layer and arranged in the pixel array;
a color filter layer disposed proximate to the semiconductor layer, wherein light is to be directed to at least a first one of the plurality of photodiodes through the color filter layer, wherein the light is to be directed to said at least the first one of the plurality of photodiodes through a backside of the pixel array;
an optical shield layer disposed proximate to the color filter layer, wherein the color filter layer is disposed between the optical shield layer and the semiconductor layer, wherein the optical shield layer shields at least a second one of the plurality of photodiodes from the light; and
a planarization layer disposed over the color filter layer such that at least a portion of the planarization layer is disposed between the optical shield layer and the color filter layer.

2. The pixel array of claim 1 wherein the semiconductor layer comprises silicon.

3. The pixel array of claim 1 further comprising one or more interlayers disposed between the semiconductor layer and the color filter layer.

4. The pixel array of claim 1 wherein the optical shield layer is deposited in the planarization layer disposed over the color filter layer.

5. The pixel array of claim 1 wherein the optical shield layer comprises metal.

6. The pixel array of claim 1 further comprising one or more lenses disposed proximate to the optical shield layer, wherein the light is to be directed through the one or more lenses and the color filter layer to the plurality of photodiodes.

7. The pixel array of claim 3 wherein the one or more interlayers comprises at least one of silicon nitride and silicon carbide.

8. An imaging system comprising:
   a pixel array including:
      a plurality of photodiodes disposed in a semiconductor layer and arranged in the pixel array;
      a color filter layer disposed proximate to the semiconductor layer, wherein light is to be directed to at least a first one of the plurality of photodiodes through the color filter layer, wherein the light is to be directed to said at least the first one of the plurality of photodiodes through a backside of the pixel array;
      an optical shield layer disposed proximate to the color filter layer, wherein the color filter layer is disposed between the optical shield layer and the semiconductor layer, wherein the optical shield layer shields at least a second one of the plurality of photodiodes from the light; and
      a planarization layer disposed over the color filter layer such that at least a portion of the planarization layer is disposed between the optical shield layer and the color filter layer;
   control circuitry coupled to the pixel array to control operation of the pixel array; and
   readout circuitry coupled to the pixel array to readout image data from the pixel array.

9. The imaging system of claim 8 wherein each pixel of the pixel array comprises at least one of the plurality of the photodiodes.

10. The imaging system of claim 8 further comprising function logic coupled to the readout circuitry to store the image data readout from the pixel array.

11. The imaging system of claim 8 wherein the semiconductor layer comprises silicon.

12. The imaging system of claim 8 wherein the pixel array further includes one or more interlayers disposed between the semiconductor layer and the color filter layer.

13. The imaging system of claim 8 wherein the optical shield layer is deposited in planarization layer disposed over the color filter layer.

14. The imaging system of claim 8 wherein the optical shield layer comprises metal.

15. The imaging system of claim 8 wherein the pixel array further comprises one or more lenses disposed proximate to the optical shield layer, wherein the light is to be directed through the one or more lenses and the color filter layer to the plurality of photodiodes.

16. The imaging system of claim 12 wherein the one or more interlayers comprises at least one of silicon nitride and silicon carbide.

17. A method of fabricating a pixel array comprising:
   forming a plurality of photodiodes in a semiconductor layer and arranged in the pixel array;
   forming a color filter layer proximate to the semiconductor layer, wherein light is to be directed to at least a first one of the plurality of photodiodes through the color filter layer, wherein the light is to be directed to said at least the first one of the plurality of photodiodes through a backside of the pixel array;
   depositing an optical shield layer proximate to the color filter layer, wherein the color filter layer is disposed between the optical shield layer and the semiconductor layer, wherein the optical shield layer shields at least a second one of the plurality of photodiodes from the light; and
   depositing at least a portion of a planarization layer prior to depositing the optical shield layer such that said at least the portion of the planarization layer is disposed between the optical shield layer and the color filter layer.

18. The method of claim 17 wherein forming the plurality of photodiodes in the semiconductor layer comprises forming the plurality of photodiodes in a silicon semiconductor layer.

19. The method of claim 17 further comprising depositing one or more interlayers proximate to the semiconductor layer prior to depositing the color filter layer such that the one or more interlayers are disposed between the semiconductor layer and the color filter layer.

20. The method of claim 17 wherein the optical shield layer comprises metal.

21. The method of claim 17 further comprising forming one or more lenses proximate to the planarization layer, wherein the light is to be directed through the one or more lenses and the color filter layer to the plurality of photodiodes.

22. The method of claim 19 wherein the one or more interlayers comprises at least one of silicon nitride and silicon carbide.

* * * * *